United States Patent
Lakshmanan et al.

(10) Patent No.: US 12,306,245 B2
(45) Date of Patent: May 20, 2025

(54) ON-CHIP CURRENT SENSOR

(71) Applicant: Texas Instruments Incorporated, Dallas, TX (US)

(72) Inventors: Guha Lakshmanan, Karnataka (IN); Rakesh Hariharan, Karnataka (IN); Lakshmanan Balasubramanian, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 394 days.

(21) Appl. No.: 17/139,246

(22) Filed: Dec. 31, 2020

(65) Prior Publication Data

US 2021/0208197 A1   Jul. 8, 2021

Related U.S. Application Data

(60) Provisional application No. 62/956,548, filed on Jan. 2, 2020.

(51) Int. Cl.
*G01R 31/317*   (2006.01)
*G01R 3/00*   (2006.01)

(52) U.S. Cl.
CPC ......... *G01R 31/31721* (2013.01); *G01R 3/00* (2013.01)

(58) Field of Classification Search
CPC .... G01R 3/00; G01R 31/317; G01R 31/2884; G01R 31/3167; G01R 31/31721; G01R 1/067; G01R 19/145; G01R 31/2889; G01R 31/318511
USPC .................................................... 324/750.3
See application file for complete search history.

(56) References Cited

U.S. PATENT DOCUMENTS

| | | | | |
|---|---|---|---|---|
| 6,429,641 | B1* | 8/2002 | Montrose | G01R 19/2509 324/123 C |
| 6,944,556 | B1* | 9/2005 | Roach | G01R 19/0092 702/57 |
| 9,429,625 | B1* | 8/2016 | Ding | G01R 31/40 |
| 2002/0180418 | A1* | 12/2002 | Jones | G01R 19/0092 324/118 |
| 2006/0202707 | A1* | 9/2006 | Harjung | G01R 31/3004 324/756.04 |

(Continued)

OTHER PUBLICATIONS

"MSP430FR604x(1), MSP430FR603x(1) Ultrasonic Sensing MSP430™ Microcontrollers for Water-Metering Applications", Texas Instruments, SLASEB7D—Jun. 2017—Revised Dec. 2020, 183 pgs.

*Primary Examiner* — Alesa Allgood
*Assistant Examiner* — Courtney G McDonnough
(74) *Attorney, Agent, or Firm* — Ronald O. Neerings; Frank D. Cimino

(57) ABSTRACT

A packaged electronic device has a die with a load circuit, a resistor and an analog to digital converter (ADC). The resistor is coupled between a supply node of the die and a power input of the load circuit. The ADC has a first input coupled to a first terminal of the resistor, and a second input coupled to a second terminal of the resistor to measure a voltage across the resistor while a supply voltage is applied to the supply node to determine a load current conducted by the load circuit. A method of manufacturing a packaged electronic device includes wafer processing to fabricate the load circuit, the resistor and the ADC on or in a die area of the wafer with the resistor coupled between the power input of the load circuit and the supply node of the die area.

20 Claims, 6 Drawing Sheets

(56) References Cited

U.S. PATENT DOCUMENTS

2010/0085087 A1   4/2010  Dash et al.
2019/0178913 A1\*  6/2019  Narikawa .......... G01R 1/07342

\* cited by examiner

ON-CHIP CURRENT SENSOR

CROSS-REFERENCE TO RELATED APPLICATION

This application claims priority to and benefit of U.S. Provisional Patent Application Ser. No. 62/956,548, filed on Jan. 2, 2020, and titled "A Novel Approach To Measure Current Distribution In Silicon Using On-Chip Current Sensor", the contents of which are hereby fully incorporated by reference.

BACKGROUND

Integrated circuits often include multiple circuits that each consume power during operation. Mixed signal ICs and system on chip (SOC) devices often include separate analog and digital power domains, with multiple powered circuits that represent a load within each domain. Debugging device die designs during product qualification and screening fabricated wafers and packaged devices during manufacturing are aided by characterization of the current consumption of individual circuits of a shared supply. Low power platforms with significant analog integration, for example, are sensitive to floating nodes and unintended design artefacts. However, current distribution among circuits that share a common supply voltage is difficult to measure. For example, a comparator and a shared voltage reference circuit may operate from a single supply feed in a semiconductor die. In device or design verification, current consumption of the comparator cannot be tested independently of the voltage reference circuit. Thus, while functional or electrical operation of a comparator and a voltage reference may be tested independently, the current consumption of the comparator and voltage reference cannot be characterized and quantified independently. Detection of an excessive quiescent current flowing from the shared supply does not allow separate detection of defects in the individual comparator and voltage reference circuits. Measurement at the analog or digital domain supply source is not reliable when the device has unintended design or manufacturing issues like floating nodes, excessive leakage and latch up. Moreover, techniques to estimate or derive individual circuit current draws based on a single supply current measurement can be inaccurate. Thermal imaging techniques can sometimes detect hot spots but are not precise and require significant time to identify contributors to high quiescent current consumption in a particular section of a wafer or die.

SUMMARY

In accordance with one aspect, a packaged electronic device includes a load circuit, a resistor and an analog to digital converter (ADC) in a die. The resistor is coupled between a supply node of the die and a power input of the load circuit. The ADC has a first input coupled to a first terminal of the resistor, and a second input coupled to a second terminal of the resistor to measure a voltage across the resistor while a supply voltage is applied to the supply node to determine a load current conducted by the load circuit.

In another aspect, a method of manufacturing a packaged electronic device includes wafer processing to fabricate a load circuit, a resistor and an ADC on or in a die area of a wafer with the resistor coupled between the power input of the load circuit and the supply node of the die area.

In a further aspect, a method includes processing a wafer to fabricate a load circuit, a resistor and an ADC on or in a die area of the wafer, in which the resistor is coupled between a power input of the load circuit and a supply node of the die area, as well as separating a die area from the wafer to provide a die including the load circuit, the resistor and the ADC, and packaging the die to create a packaged electronic device.

DETAILED DESCRIPTION

Figure 1:
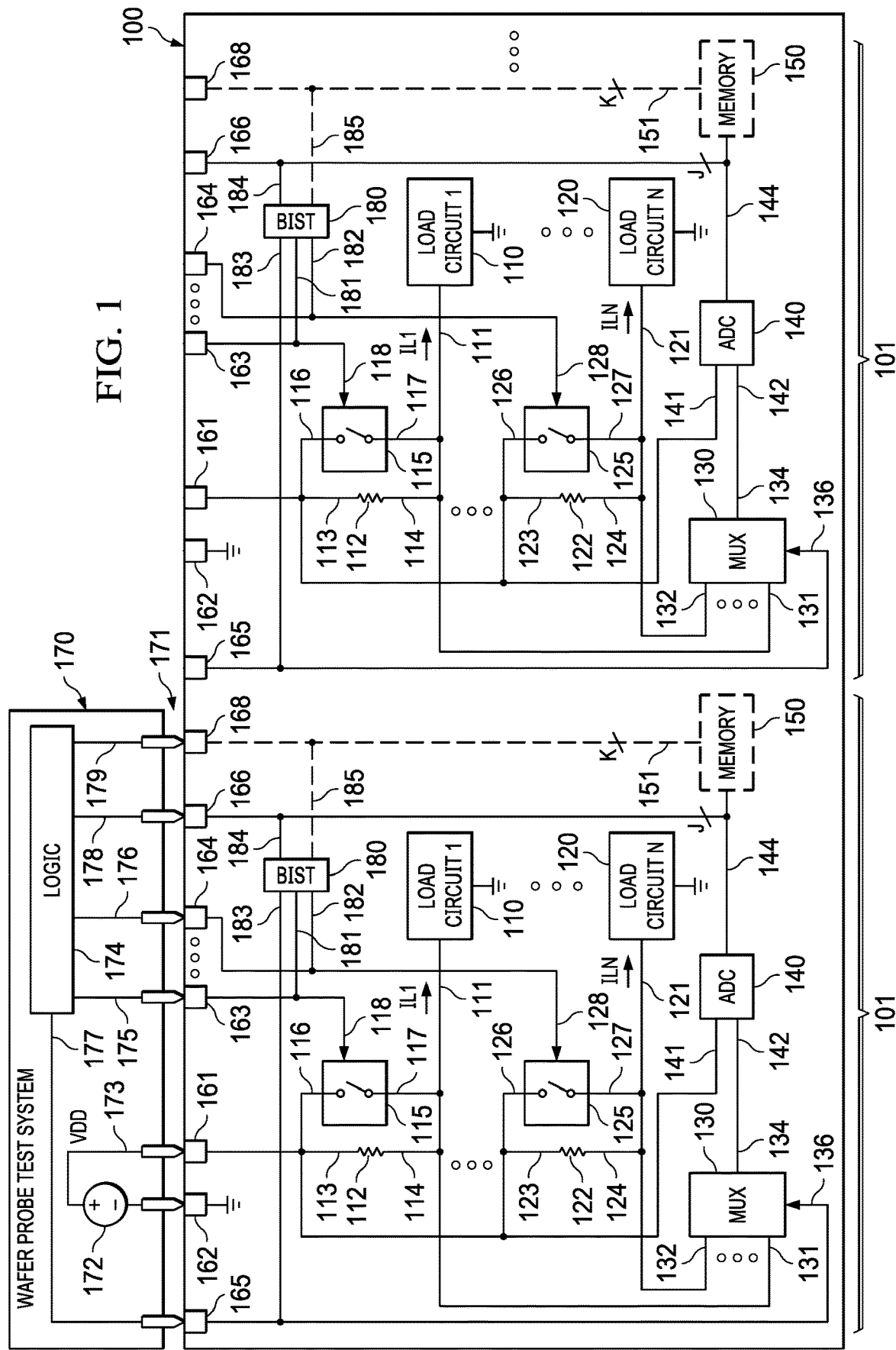
FIG. 1 is a partial schematic view of a fabricated semiconductor wafer with multiple die areas having respective load circuits, series coupled resistors and an ADC undergoing wafer probe testing to measure load currents of multiple load circuits in a first die area.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 2:
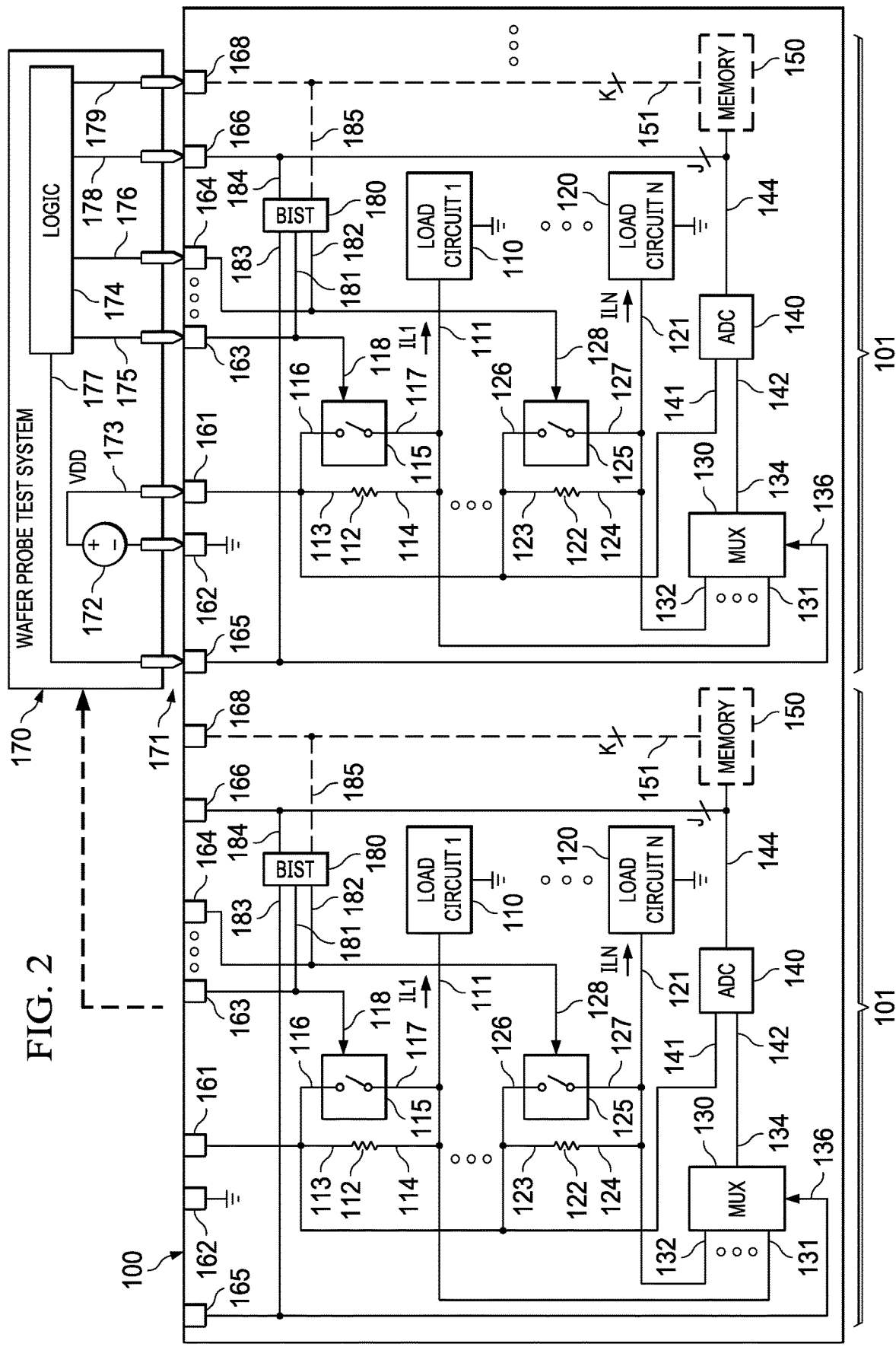
FIG. 2 is a partial schematic view of the fabricated semiconductor wafer of FIG. 1 undergoing wafer probe testing to measure load currents of multiple load circuits in a second die area.

Referring initially to FIGS. 1 and 2, described examples provide on-die or on-chip series resistance coupled between a shared supply node and a load circuit in the die to facilitate measurement of individual current draws of one or more separate load circuits that share a supply node. The apparatus and techniques of the described examples help to identify individual circuit current draws during product qualification, during production including wafer probe testing and/or final device testing, as well as built-in self-testing (BIST) during operation of an electronic device in field use. FIG. 1 shows a processed semiconductor wafer 100 at wafer probe testing. The wafer 100 includes multiple die areas 101, two of which are schematically illustrated in detail. FIG. 1 shows wafer probe testing to measure load currents of multiple load circuits in a first die area 101, and FIG. 2 shows continued wafer probe testing to measure load currents of multiple load circuits in a second die area of the wafer 100. The respective die areas 101 include series coupled resistors and an ADC to facilitate localized current measurements of individual load circuits of the respective die areas 101.

The die areas 101 are similarly arranged in FIG. 1. The respective die areas 101 include a first load circuit 110 having a first power input 111, as well as a first resistor 112. The first resistor 112 has a first terminal 113 and a second terminal 114. The respective die areas 101 also include a first switch 115 having a first terminal 116, a second terminal 117 and a first control input 118. The respective die areas 101 also include a second load circuit 120 having a second power input 121, and a second resistor 122 with a first terminal 123 and a second terminal 124. The respective die areas 101 also include a second switch 125. The second switch 125 has a first terminal 126, a second terminal 127, and a second control input 128. In one example, the first switch 115 and the second switch 125 are transistors, such as field effect transistors (FETs) or bipolar transistors.

The respective die areas 101 include a multiplexer 130 having a first input 131, a second input 132, an output 134 and a control input 136. Also, the respective die areas 101 include an analog to digital converter (ADC) 140. In one example, the ADC 140 is a dual use circuit that has switchable inputs and outputs for use in load current measurements during testing and is used for other functions in normal operation of a finished electronic device. In another example, the ADC is an existing or low-cost ADC such as a voltage-controlled oscillator (VCO) based ADC to conserve product cost and die area. In one example, the resistors 112 and 122 are polysilicon resistors fabricated in or on the silicon wafer 100 to provide a small, precision resistance with parallel or series power switching connections. In another example, the resistors 112 and 122 are fabricated in a metallization structure, for example, in an uppermost metallization level to allow the resistors to be later removed from a given design if it is determined that separate sub circuit load current measurements are no longer needed. The ADC 140 has a first input 141, a second input 142 and an output 144. In the illustrated example, the respective die areas 101 include a memory 150 coupled to the output 134 of the multiplexer 130. In another example, the memory 150 is omitted. In one example, the ADC 140 has a single bit serial output 144. In another example, the ADC 140 has a multi-bit parallel output 144 having an integer number J lines, where J is greater than 1. In one example, the memory 150 has a single bit serial output 151. In another example, the memory 150 has a multi-bit parallel output 151 having an integer number K lines, where K is greater than 1.

Figure 3:
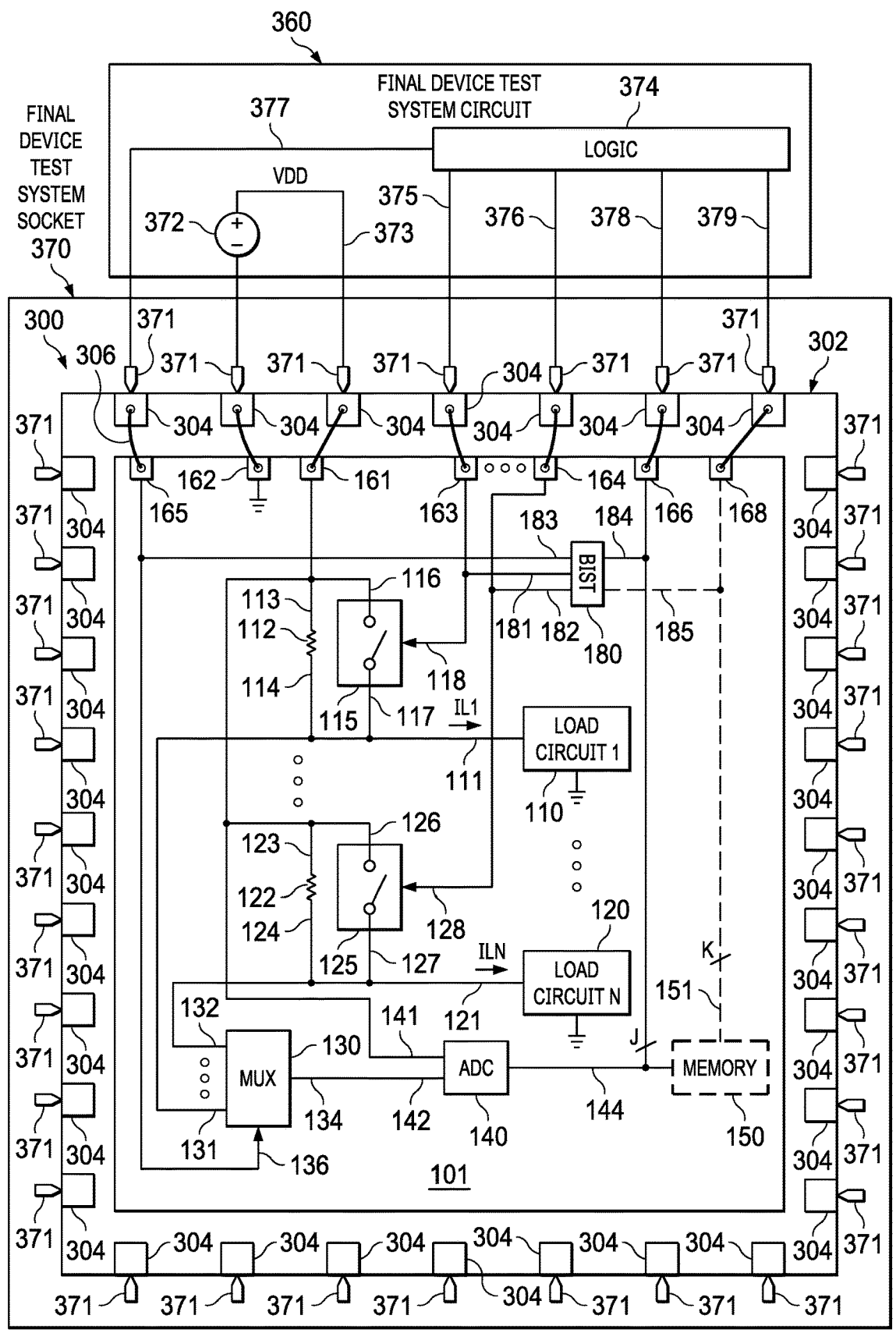
FIG. 3 is a partial schematic view of a packaged electronic device having a semiconductor die with the load circuits, series coupled resistors and ADC of one die area of the wafer in FIG. 1 undergoing a final device test to measure the load currents of multiple load circuits in the die.

The respective die areas 101 also include conductive features, such as copper or aluminum bond pads that are exposed along a side or surface of the respective die areas 101 to allow mechanical contact and electrical coupled for use during wafer probe testing and/or for electrical coupling during packaging (e.g., wire bonding or direct soldering) to electrically couple nodes of the circuitry of the individual die areas 101 with conductive leads of a packaged electronic device, as illustrated further below in connection with FIG. 3. The wafer 100 of FIGS. 1 and 2 includes conductive bond pads 161, 162, 163, 164, 165, 166 and 168 in each of the respective die areas 101. The first conductive bond pad in this example is a supply node 161 configured to couple a voltage signal or supply voltage VDD from an external power supply to various circuitry of a probed die area 101. The supply node can be a node that couples an output of an external supply, or an output of an on-chip supply, for example, to measure the current of the load supplied by an on-chip supply like a low drop out (LDO), linear and/or switching voltage regulator. This example can use a primary supply from an external source powering the on-chip supply and the on-chip supply further supplying the various loads for current consumption testing. Combinations of various loads on the primary supply and on-chip supply, and further having multiple on-chip supplies delivering power to different sets of loads are also possible.

FIG. 1 also shows an example wafer probe test system 170 with conductive probe pins or probe needles 171 configured to probe (i.e., make mechanical contact with, and form electrical coupling to) the respective conductive bond pads 161, 162, 163, 164, 165, 166 and 168 of a selected one of the die areas 101 during wafer probe testing. FIG. 2 shows the wafer 100 undergoing wafer probe testing to measure load currents of multiple load circuits in the second die area 101. The wafer probe test system 170 includes a power supply 172 with an output terminal 173 coupled to the supply node 161 of the probed die area 101 via an associated probe needle 171. A ground or reference terminal of the power supply 172 is coupled to a circuit reference voltage node 162 or ground of the probed circuit via an associated probe needle 171. The wafer probe test system 170 also includes a logic circuit 174, such as a state machine or programmed processor, which has outputs 175, 176 and 177, as well as single or multi-bit inputs 178 and 179.

The first terminal 113 of the first resistor 112 is coupled to the supply node 161, and the second terminal 114 of the first resistor 112 is coupled to the power input 111 of the first load circuit 110. The resistor 122 is coupled between the power input 121 of the load circuit 120 and the supply node 161 of the die area 101. The first terminal 123 of the second resistor 122 is coupled to the supply node 161, and the second terminal 124 of the second resistor 122 is coupled to the second power input 121. The first terminal 116 of the first switch 115 is coupled to the first terminal 113 of the first resistor 112. The second terminal 117 of the first switch 115 is coupled to the second terminal 114 of the first resistor 112. The first terminal 126 of the second switch 125 is coupled to the first terminal 123 of the second resistor 122. The second terminal 127 of the second switch 125 is coupled to the second terminal 124 of the second resistor 122. The first input 131 of the multiplexer 130 is coupled to the second terminal 114 of the first resistor 112. The second input 132 of the multiplexer 130 is coupled to the second terminal 124 of the second resistor 122. The first input 141 of the ADC 140 is coupled to the first terminal 113 of the first resistor 112 and also coupled to the first terminal 123 of the second resistor 122. The second input 142 of the ADC 140 is coupled to the second terminal 114 of the first resistor 112 or to the second terminal 124 of the second resistor 122 via the output 134 of the multiplexer 130. The illustrated examples have a common supply side of the connection to the first input 141 of the ADC. In an alternative example, separate inputs are coupled to the first input 141 of the ADC 140, for example, using an additional multiplexer (not shown), such as where the supply side connection is not necessarily the same node. For example, this can be done when a star or Kelvin connection of supplies to individual load circuits are not necessary.

The respective die areas 101 also include a test circuit 180, such as a built-in self-test (BIST) circuit. The test circuit 180 has a first output 181, a second output 182 and a third output 183, as well as single or multi-bit inputs 184 and 185. The first output 181 of the test circuit 180 is coupled to the first control input 118 of the first switch 115. The second output 182 of the test circuit 180 is coupled to the second control input 128 of the second switch 125. The third output 183 of the test circuit 180 is coupled to the control input 136 of the multiplexer 130. The first input 184 of the test circuit 180 is coupled to the single or multi-bit output 144 of the ADC 140. The second input 185 of the test circuit 180 is coupled to the single or multi-bit output 151 of the memory 150.

During wafer probe testing in one example, the wafer probe test system 170 probes the first die area 101 as shown in FIG. 1. With the probe needles 171 engaged to the conductive bond pads 161, 162, 163, 164, 165, 166 and 168 of the selected die area 101, the logic circuit 174 of the wafer probe test system 170 sets voltage signals at the switch control outputs 175 and 176 to open the first switch 115 and close the second switch 125. The power supply 172 provides a non-zero supply voltage VDD to the supply node 161 to supply the first load circuit 110 through the series resistance of the first resistor 112, and to directly supply VDD to the second power input 121 of the second load circuit 120.

The logic circuit 174 of the wafer probe test system 170 sets the output 177 to select the first multiplexer channel and couple the first input 131 of the multiplexer 130 to the multiplexer output 134. The ADC 140 converts the voltage across the first resistor 112 to a digital value that represents the load current IL1 conducted by the first load circuit 110. In one example, the converted value is stored in the memory 150. The logic circuit 174 of the wafer probe test system 170 reads a converted digital value from the ADC output 144 (or from the memory output 151). In one example, the wafer probe test system 170 obtains a single converted value and determines the corresponding first load current IL1 based on a resistance of the first resistor 112. In another example, the wafer probe test system 170 obtains multiple converted values and determines the first load current IL1 based on the converted values and the resistance of the first resistor 112, for example, using averaging. In this manner, the wafer probe test system 170 measures the voltage across the first resistor 112 using the ADC 140 while applying the supply voltage VDD to the supply node 161 to determine the first load current IL1 conducted by the first load circuit 110.

With the probe needles 171 still engaged to the conductive bond pads 161, 162, 163, 164, 165, 166 and 168 of the selected die area 101, the wafer probe test system 170 measures a voltage across a second resistor 122 coupled between the supply node 161 and the second power input 121 of a second load circuit 120 using the ADC 140 while applying the supply voltage VDD to the supply node 161 to determine a second load current ILN conducted by the second load circuit 120. The logic circuit 174 of the wafer probe test system 170 sets the voltage signals at the switch control outputs 175 and 176 to close the first switch 115 and open the second switch 125. This couples the second resistor 122 coupled between the supply node 161 and the second power input 121 of the second load circuit 120, and directly couples the supply node 161 to the first power input 111 of the first load circuit 110.

In this configuration, the power supply 172 provides the non-zero supply voltage VDD to the supply node 161 to supply the second load circuit 120 through the series resistance of the second resistor 112, and directly supplies the supply voltage VDD to the first power input 111 of the first load circuit 110. The logic circuit 174 of the wafer probe test system 170 sets the output 177 to select the second multiplexer channel and couple the second multiplexer input 132 to the multiplexer output 134. The ADC 140 converts the voltage across the second resistor 122 to a digital value that represents the second load current ILN conducted by the second load circuit 120. In one example, the converted value is stored in the memory 150. The logic circuit 174 of the wafer probe test system 170 reads a converted digital value from the ADC output 144 (or from the memory output 151). In one example, the wafer probe test system 170 obtains a single converted value and determines the corresponding second load current ILN based on a resistance of the second resistor 122. In another example, the wafer probe test system 170 obtains multiple converted values and determines the second load current ILN based on the converted values and the resistance of the second resistor 122, for example, using averaging. In this manner, the wafer probe test system 170 measures the voltage across the second resistor 122 using the ADC 140 while applying the supply voltage VDD to the supply node 161 to determine the second load current ILN conducted by the second load circuit 120.

The on-state resistances of the switches 115 and 125 in one example are significantly less than the resistances of the first and second resistors 112 and 122, for example, by three or more orders of magnitude. In one example, moreover, the off-state resistances of the switches 115 and 125 are significantly greater than the resistances of the first and second resistors 112 and 122, for example, by three or more orders of magnitude. The resistances of the first and second resistors 112 and 122 in one example are equal. In another example, the resistances of the first and second resistors 112 and 122 are different. The resistances of the first and second resistors 112 and 122 are set in one implementation to provide a voltage across the first and second resistors 112 and 122 of a suitable range to facilitate conversion by the ADC 140 when the respective load currents IL1 and ILN are in an expected range for a given design of the first and second load circuits 110 and 120.

The die areas 101 in one example include two or more load circuits and corresponding resistor and switch circuitry to accommodate local load current measurement of any integer number N load circuits, where N is greater than 1. In one example, the logic circuit 174 of the wafer probe test system 170 opens a selected one of the switches 115, 125 and closes all the other switches to measure the selected voltage across the corresponding resistor 112, 122 while all the other load circuits 110, 120 are directly coupled to the supply node 161, and repeats the process for individual measurements of all the load circuits. As shown in FIG. 2, the wafer probe test system 170 is then moved (e.g., or the wafer 100 is moved relative to a probe head of the wafer probe test system 170) to probe a second die area 101 of the wafer 100. The load current measurements are then performed using the on-chip or on-die series resistance for individual load circuits of the newly selected die area 101 as described above.

Referring also to FIG. 3, the on-die circuitry can also be used during final device testing to verify or quantify the load circuit current draw of the first and second load circuits 110, 120 after the wafer dies are singulated and packaged into a packaged electronic device. FIG. 3 shows a packaged electronic device 300 having a semiconductor die 101 that corresponds to one of the die areas 101 in the wafer 100 of FIGS. 1 and 2 above. The die 101 in FIG. 3 includes the load circuits 110 and 120, the series coupled resistors 112 and 122, the multiplexer 130, and the ADC 140, memory 150 and BIST test circuits 180 as described above. The packaged electronic device 300 also includes a molded plastic or ceramic package structure 302 that encloses all or a portion of the die 101 and encloses portions of conductive leads 304 disposed around one or more sides of the package structure 302. The packaged electronic device 300 includes a first lead 304 coupled to the first control input 118 of the first switch 115 as well as a second lead 304 coupled to the second control input 128 of the second switch 125. The packaged electronic device 300 also includes a third lead 304 coupled to the control input 136 of the multiplexer 130, and a fourth lead 304 coupled to the supply node 161. The illustrated example is a single-die quad flat no-lead (QFN) package with leads 304 along four lateral sides and a bottom of the device 300. Different package shapes and types are used in other examples, including packaged electronic devices that have more than one semiconductor die 101. The packaged electronic device 300 also includes electrical connections between one or more of the leads 304 and respective ones of the conductive bond pads 161, 162, 163, 164, 165, 166 and 168 of the die 101. This example uses bond wire connections 306. Other electric connection techniques and structures can be used in other examples, such as direct solder connections, flip chip solder ball connections, etc.

FIG. 3 shows the packaged electronic device 300 undergoing wafer probe testing using a final device test system circuit 360 to measure load currents of the first and second load circuits 110 and 120 in the die 101. The packaged electronic device 300 in FIG. 3 is installed in a final device test system socket 370 to measure the load currents of multiple load circuits in the die 101 and to perform other final tests on the device 300. The socket 370 has conductive contacts 371 configured to make mechanical contact with, and form electrical coupling to, the respective conductive bond pads 161, 162, 163, 164, 165, 166 and 168 through the corresponding device leads 304 during final device testing. The final device test system circuit 360 includes a power supply 372 with an output terminal 373 coupled to the supply node 161 of the die 101 via an associated socket contact 371. The ground or reference terminal of the power supply 372 is coupled to the circuit reference voltage node 162 or ground of the probed circuit via an associated contact 371.

The final device test system circuit 360 also includes a logic circuit 374, such as a state machine or programmed processor, which has outputs 375, 376 and 377, as well as single or multi-bit inputs 378 and 379. The power supply 372 and the logic circuit 374 operate in similar fashion to the power supply 172 and logic circuit 174 described above to operate the outputs 375-377 and measure the load currents IL1 and ILN using the ADC 140 and the series resistances of the selectively connected on-chip or on-die resistors 112 and 122. After final device testing and installation of the packaged electronic device 300 in a user system (e.g., a host printed circuit board (PCB, not shown), the test circuit 180 operates to close the switches 115 and 125 via the control inputs 118 and 128 to allow normal operation of the load circuits 110 and 120 with no additional series resistance. In addition, the test circuit 180 is configured in one example to enter a test mode and measure one or both individual load currents IL1 and ILN for prognostic and/or diagnostic evaluation or analysis and optionally take one or more remedial actions based on the analysis. In addition, the wafer probe and packaged final tests can be used to characterize the resistance values for resistances 112, and 122 to aid calculating current draw of loads 110 and 120 using voltage measurements through the ADC 140. In addition, the test circuit 180 can be used during wafer probe and package final tests after the resistance value characterization step to perform the measurements of current consumption of loads 110 and 120 using a low cost or low pin count test system that avoids externally driving one or more of the control signals 118, 128 and 136 of the switch 115, the switch 125 and the multiplexer 136, respectively. In one example of this implementation, the output 144 of the ADC 140 and/or the output 151 of the memory 150 can be read by external test equipment for every current consumption measurement. In another example, only a final transfer of a block of digital data from the memory 150 is read by the external test equipment following automated built in testing using the test circuit 180 to obtain all measurements done in the session once. In another example, the external test system (for wafer probe testing or final device testing) manages generation of the control signals 118, 128 and 136 for individual or grouped load current consumption, and the built-in test system 180 generates the control signals during field operation of a packaged electronic device.

Figure 4:
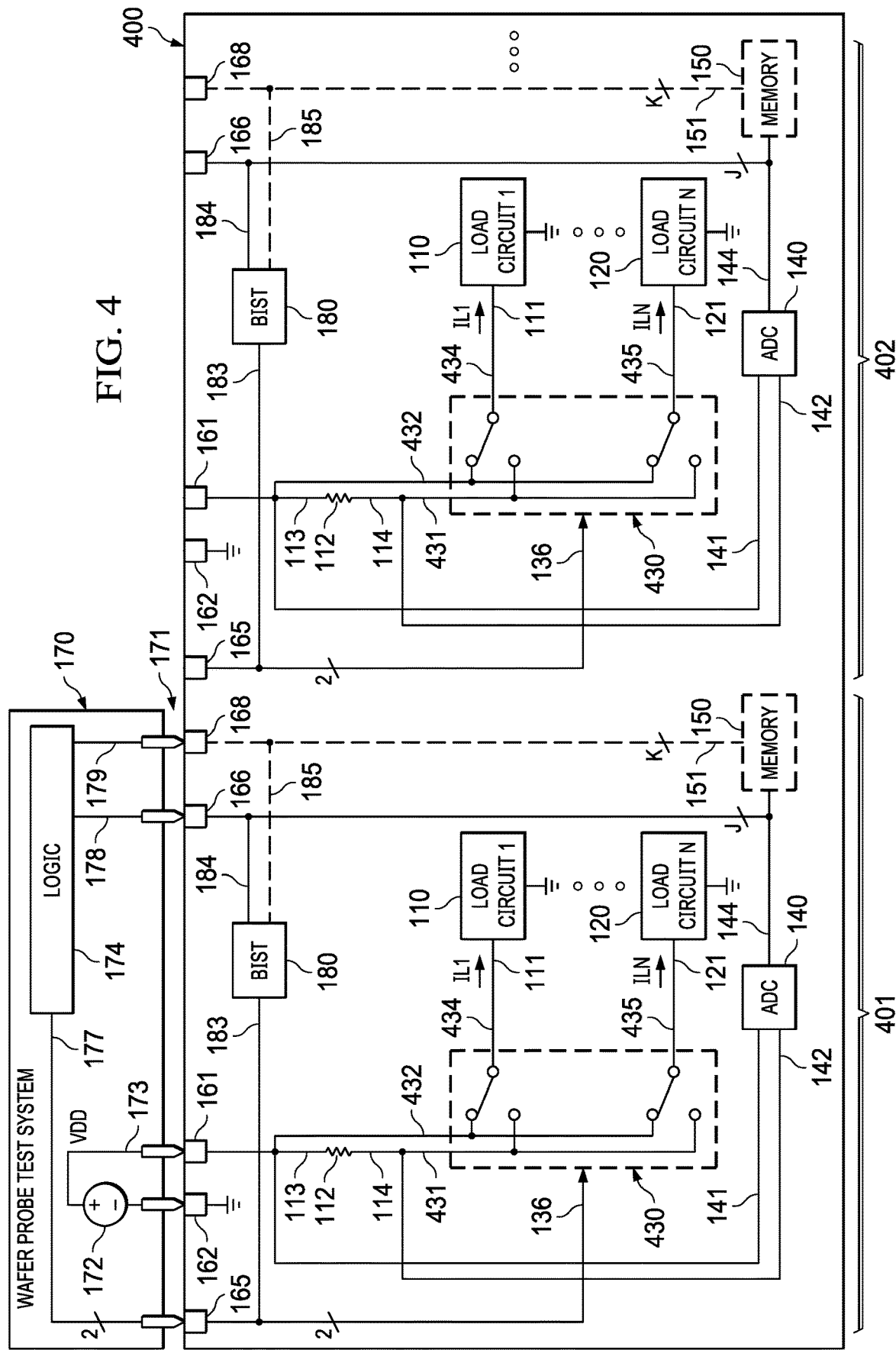
FIG. 4 is a partial schematic view of another fabricated semiconductor wafer with multiple die areas having respective load circuits, a switched resistor and an ADC undergoing wafer probe testing to measure load currents of multiple load circuits in a first die area.

FIG. 4 shows another fabricated semiconductor wafer 400 with multiple die areas 401 having respective load circuits 110 and 120 as described above in connection with FIGS. 1-3. The wafer 400 of FIG. 4 includes die areas 101 that individually have the first resistor 112 with the first and second terminals 113 and 114 as previously described, as well as the ADC 140, memory 150 and BIST test circuit 180 as described above. In this example, the first resistor 112 is shared for switched use in measuring the local load currents IL1, . . . , ILN by a switching circuit 430 for wafer probe testing using the wafer probe test system 170 and/or for final device testing (e.g., using the final device test system circuit 360 and socket 370 described above in connection with FIG. 3, and/or for field testing (e.g., BIST) using the test circuit 180). The switching circuit 430 has respective first and second inputs 431 and 432, as well as respective first and second outputs 434 and 435, and the control input 136. The first input 431 of the switching circuit 430 is coupled to the second terminal 114 of the resistor 112. The second input 432 of the switching circuit 430 is coupled to the first terminal 113 of the resistor 112. The first output 434 of the switching circuit 430 is coupled to the power input 111. The second output 435 of the switching circuit 430 is coupled to the second power input 121. The test circuit 180 in this example has an output 183 coupled to the control input 136 of the switching circuit 430, and the conductive bond pad 165 couples the logic circuit output 177 to the control input 136 of the switching circuit 430.

The switching circuit 430 in FIG. 4 is configured to selectively operate in one of three states: TEST 1, TEST 2 and OPERATE, responsive to a two-bit signal at the control input 136 of the switching circuit 430. In the first state (TEST1), the logic circuit 174 controls the signal at the output 177 to operate the switching circuit 430 such that the first output 434 of the switching circuit 430 is coupled to the first input 431 of the switching circuit 430 and the second output 435 of the switching circuit 430 is coupled to the second input 432 of the switching circuit 430. This state facilitates load current measurement of the first load current IL1 according to the voltage across the resistor 112 coupled between the supply node 161 and the first power input 111. In the second state (TEST2), the first output 434 of the switching circuit 430 is coupled to the second input 432 of the switching circuit 430, and the second output 435 of the switching circuit 430 is coupled to the first input 431 of the switching circuit 430. This state facilitates load current measurement of the second load current ILN according to the voltage across the resistor 112 coupled between the supply node 161 and the second power input 121. In the third state (OPERATE), the first output 434 and the second output 435 of the switching circuit 430 are coupled to the second input 432 of the switching circuit 430. This allows normal operation of the load circuits 110 and 120 with no additional series resistance. In addition, the test circuit 180 is configured in one example to enter a test mode and measure one or both individual load currents IL1 and ILN for prognostic and/or diagnostic evaluation or analysis and optionally take one or more remedial actions based on the analysis. In general, the test circuit implements N+1 states corresponding to N load circuits, N states to enable independent current measurement of each of the N load circuits, and one state for normal operation. In other implementations, further optimization/generalization in prognosis/diagnosis is possible to obtain more detailed diagnostic information by adding additional states that can enable measurement of combined current consumption of more than one load circuits.

Figure 5:
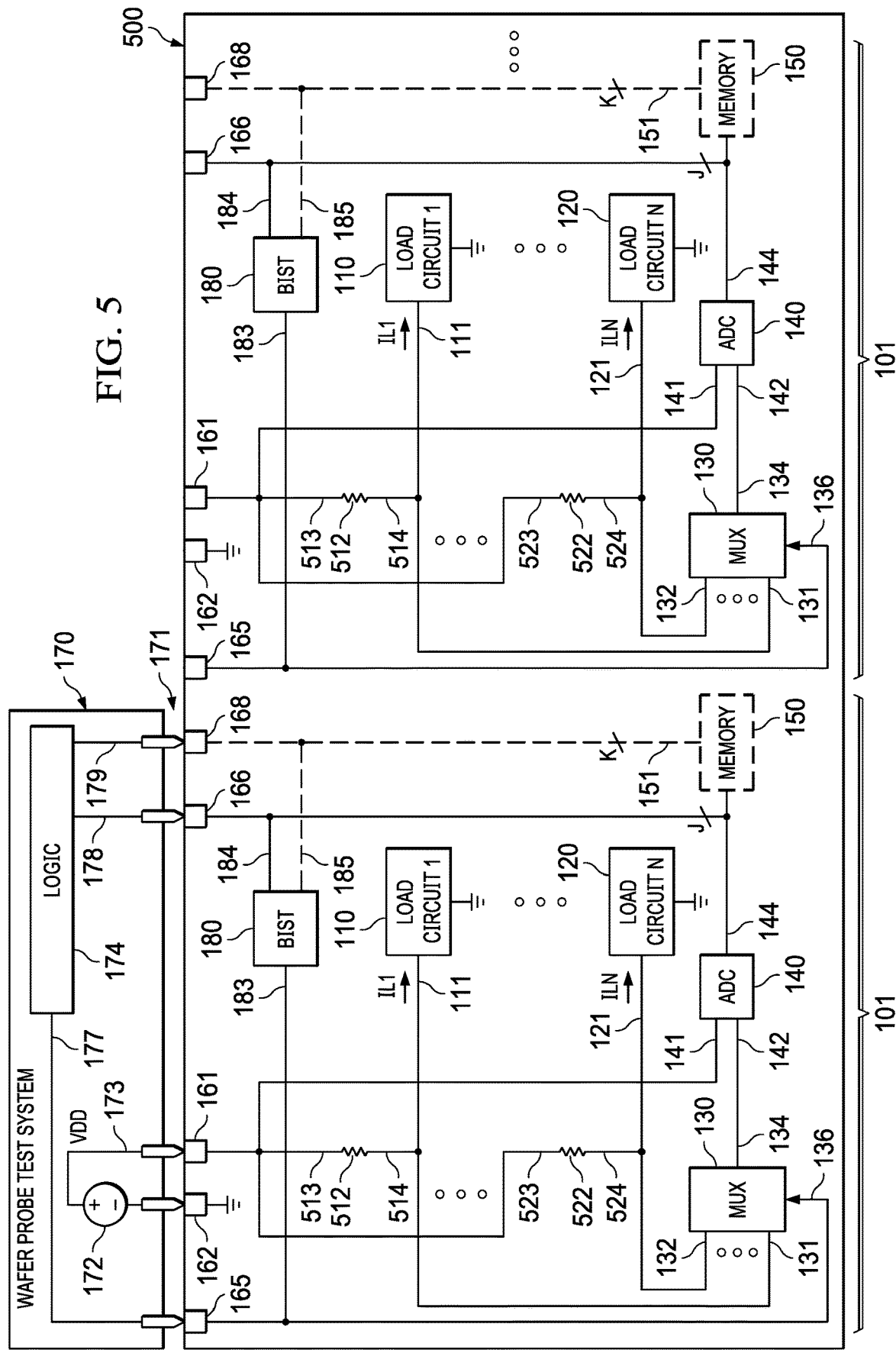
FIG. 5 is a partial schematic view of another fabricated semiconductor wafer with multiple die areas having respective load circuits, series coupled parasitic resistors and an ADC undergoing wafer probe testing to measure load currents of multiple load circuits in a first die area.

FIG. 5 shows another example fabricated semiconductor wafer 500 with multiple die areas having respective load circuits, series coupled parasitic resistors 512 and 522, a multiplexer 130 and an ADC 140 undergoing wafer probe testing to measure load currents IL1 and ILN of the load circuits 110 and 120 in a first die area 101. In this example, the first resistor 512 is a parasitic resistance of power routing in the wafer 500 from the supply node 161 to the first power input 111. The second resistor 522 is a parasitic resistance of power routing in the wafer 500 from the supply node 161 to the second power input 121. The first resistor 512 in this example has a first terminal 513 coupled to the supply node 161, and a second terminal 514 coupled to the power input 111 of the first load circuit 110. The second resistor 522 has a first terminal 523 coupled to the supply node 161 and a second terminal 524 coupled to the second power input 121 of the second load circuit 120. The first input 131 of the multiplexer 130 is coupled to the second terminal 514 of the first resistor 512. The second input 132 of the multiplexer 130 is coupled to the second terminal 524 of the second resistor 522. The first input 141 of the ADC 140 is coupled to the first terminal 513 of the first resistor 512 as well as to the first terminal 523 of the second resistor 522, and the second input 142 of the ADC 140 is coupled to the output 134 of the multiplexer 130.

The resistances are characterized empirically by laboratory measurements or computed during design of the wafer 500, and the values of the resistances are used in computing the load currents IL1 and ILN based on the measured voltages between the supply node 161 and the respective power inputs 111, 121 of the load circuits 110 and 120. In one example, the trace routing from the supply node 161 to the first resistor terminals 513 and 523 and to the first ADC input 141 are star connected and do not share trace lengths to accurately measure the load currents independent of other parasitic effects in the wafer 500.

Figure 6:
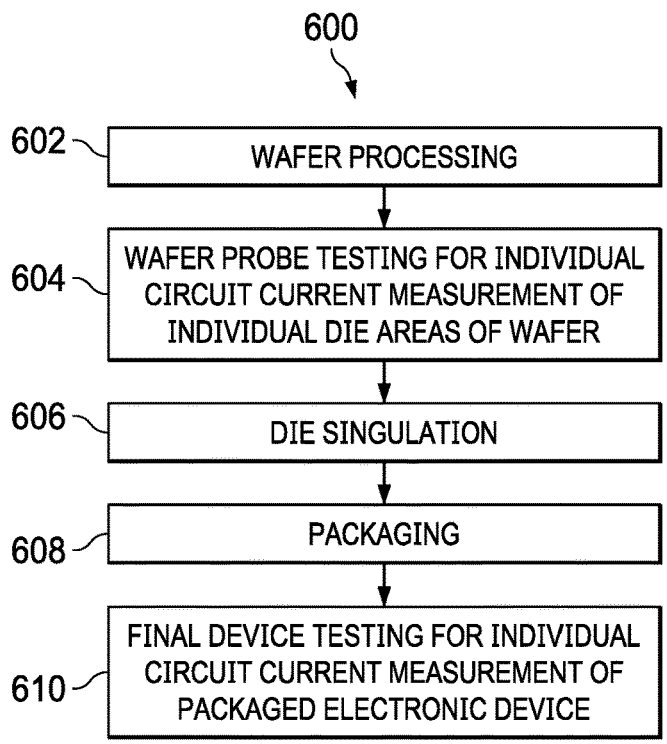
FIG. 6 is a flow diagram of a method of manufacturing a packaged electronic device with an included method of wafer processing and included wafer probe and final device testing methods.

FIG. 6 shows a method 600 of manufacturing a packaged electronic device, such as the device 300 of FIG. 3 above. The method 600 includes a wafer processing method, as well as wafer probe and final device testing methods. The method includes processing a wafer at 602 to fabricate one or more components for normal circuit operation (e.g., the first and second load circuits 110 and 120 above), as well as to fabricate designed for test (DFT) circuitry such as the resistors 112 and 122 and the ADC 140 on or in the respective die areas 101 of the wafer 100, where the resistor 112 is coupled between the power input 111 of the load circuit 110 and the supply node 161 of the die area 101. In one example, the wafer processing at 602 includes fabricating components of the built-in self-test circuit 180 in individual die areas 101 of the processed wafer 100.

The method 600 also includes wafer probe testing at 604. In one example, the wafer probe testing includes measuring a voltage across the resistor 112 using the ADC 140 while applying the supply voltage VDD to the supply node 161 to determine the load current IL1 conducted by the first load circuit 110. The resistor 122 is coupled between the power input 121 of the load circuit 120 and the supply node 161 of the die area 101. In other implementations, the wafer probe testing includes measuring the voltage across the second resistor 122 coupled between the supply node 161 and the second power input 121 using the ADC 140 while applying the supply voltage VDD to the supply node 161. This example also includes determining the second load current ILN conducted by the second load circuit 120. The wafer probe testing at 604 in one example is performed using the wafer probe test system 170 as described above in connection with FIGS. 1 and 2 to measure two or more circuit load currents (e.g., IL1 and ILN) for each of two or more die areas 101 of the processed wafer 100.

The method 600 in this example continues with die singulation or separation at 606 to separate individual dies 101 from the starting wafer 100, followed by packaging at 608 to construct packaged electronic devices (e.g., device 300 in FIG. 3 above) a die 101 separated from the starting wafer 100. The example in FIG. 6 includes separating a die area 101 from the wafer 100 at 606 to provide a die 101 (e.g., FIG. 3) including the load circuit 110, the resistor 112 and the ADC 140. The method 600 also includes packaging the die 101 at 608 to create the packaged electronic device 300. The packaging processing in one example includes wire bonding, molding and final device separation (e.g., sawing) to yield one or more packaged electronic devices.

The method 600 also includes final device testing at 610. In one implementation, the final testing at 610 includes installing the packaged electronic device 300 into a socket 370 as shown in FIG. 3 to couple the resistors 112 and 122, the control inputs 118, 128 and 136 and the outputs 144 and 151 with the final device test system circuit 360. The final device test system circuit 360 implements automated tests for operation parameters of the device 300, including measuring the voltages across the resistor 112 or the resistors 112 and 122 to determine the load currents IL1 and ILN conducted by the respective load circuits 110 and 120.

Figure 7:
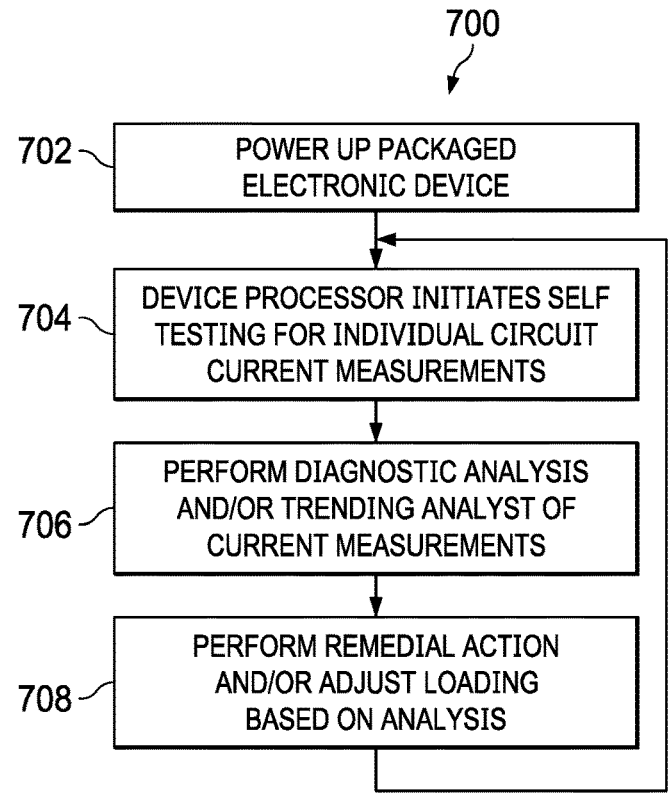
FIG. 7 is a flow diagram of a method of operating a packaged electronic device.

FIG. 7 is a flow diagram of a method of operating a packaged electronic device. In one example, following final device testing and installation of the packaged electronic device 300 in a user system (e.g., a host printed circuit board (PCB), not shown), the on-chip test circuit 180 operates when powered to close the switches 115 and 125 via the control inputs 118 and 128 to allow normal operation of the load circuits 110 and 120 with no additional series resistance. In addition, the test circuit 180 is configured in one example to enter a test mode and measure one or both individual load currents IL1 and ILN for prognostic and/or diagnostic evaluation or analysis and optionally take one or more remedial actions based on the analysis. At 702, the device 300 is powered up and a device processor (e.g., BIST test circuit 180 above) initiates self-testing for individual circuit current measurements at 704. In one example, the BIST test circuit 180 performs self-testing including measuring the load currents IL1 and ILN after circuit startup, and thereafter either periodically or according to a predetermined schedule and/or external prompting. The measured load current information can be used for a variety of diagnostic, prognostic or other purposes. At 706 in FIG. 7, the BIST test circuit 180 performs one or more diagnostic analysis computations and/or one or more power consumption trending analysis computations based on the measured load currents IL1 and ILN. At 708 in one example, the test circuit 180 performs one or more remedial actions and/or adjusts circuit loading in the packaged electronic device 300 based on the diagnostic or trending analysis. The processing at 704-708 is then repeated in one example according to a schedule or periodic testing.

The self-analysis of the local load currents IL1 and ILN facilitates real time and in-field power consumption profiling in one implementation, which is an improvement over approaches that only take a real time activity profile of independent circuit states and calculate nominal current from a lookup table (LUT) with the pre-characterized circuit consumption. The on-chip test circuitry facilitates accurate and detailed process corner and condition specific consumption profiling. These aspects also facilitate security applications, such as device or system tamper and security lapse monitoring and protection. The on-chip test circuitry facilitates secure, periodic in-field voltage and current monitoring for identifying and protecting against security lapses and tampering attempts. The on-chip test circuitry also facilitates analog functional safety for high reliability and automotive applications including fine grained power supply and current consumption monitoring and diagnostic analysis such as current consumption monitoring to identify and detect the onset of degradation or problems that are unlikely to occur during fabrication. The described examples also facilitate on-chip current distribution measurement and analysis not available in current chip designs without resorting to invasive, costly and time-consuming failure analysis (FA) techniques. The described examples instead use non-invasive circuits and techniques that can be employed during production and/or in field use to facilitate debugging and degradation onset analysis and prognostic operations.

Modifications are possible in the described examples, and other implementations are possible, within the scope of the claims.

What is claimed is:

1. A packaged electronic device, comprising:
a load circuit having a power input;
a resistor having a first terminal and a second terminal, the first terminal of the resistor coupled to a supply node, and the second terminal of the resistor coupled to the power input; and
an analog to digital converter (ADC) having a first input, a second input and an output, the first input of the ADC coupled to the first terminal of the resistor, the second input of the ADC coupled to the second terminal of the resistor.

2. A packaged electronic device, comprising:
a load circuit having a power input;
a resistor having a first terminal and a second terminal, the first terminal of the resistor coupled to a supply node, and the second terminal of the resistor coupled to the power input;
a first switch having a first terminal, a second terminal, and a first control input, the first terminal of the first switch coupled to the first terminal of the resistor, and the second terminal of the first switch coupled to the second terminal of the resistor;
a second load circuit having a second power input;

a second resistor having a first terminal and a second terminal, the first terminal of the second resistor coupled to the supply node, and the second terminal of the second resistor coupled to the second power input;
a second switch having a first terminal, a second terminal, and a second control input, the first terminal of the second switch coupled to the first terminal of the second resistor, and the second terminal of the second switch coupled to the second terminal of the second resistor;
a multiplexer having a first input, a second input, an output and a control input, the first input of the multiplexer coupled to the second terminal of the resistor, and the second input of the multiplexer coupled to the second terminal of the second resistor; and
an analog to digital converter (ADC) having a first input, a second input and an output, the first input of the ADC coupled to the first terminal of the resistor, the second input of the ADC coupled to the second terminal of the resistor.

3. The packaged electronic device of claim 2, further comprising a memory coupled to the output of the multiplexer.

4. The packaged electronic device of claim 2, further comprising:
a first lead coupled to the first control input of the first switch;
a second lead coupled to the second control input of the second switch;
a third lead coupled to the control input of the multiplexer; and
a fourth lead coupled to the supply node.

5. The packaged electronic device of claim 2, further comprising a test circuit having first output, a second output and a third output, the first output coupled to the first control input of the first switch, the second output coupled to the second control input of the second switch, and the third output coupled to the control input of the multiplexer.

6. A packaged electronic device, comprising:
a load circuit having a power input;
a resistor having a first terminal and a second terminal, the first terminal of the resistor coupled to a supply node, and the second terminal of the resistor coupled to the power input;
an analog to digital converter (ADC) having a first input, a second input and an output, the first input of the ADC coupled to the first terminal of the resistor, the second input of the ADC coupled to the second terminal of the resistor;
a second load circuit having a second power input; and
a switching circuit having a first input, a second input, a first output, a second output and a control input, the first input of the switching circuit coupled to the second terminal of the resistor, and the second input of the switching circuit coupled to the first terminal of the resistor, the first output of the switching circuit coupled to the power input, and the second output of the switching circuit coupled to the second power input.

7. The packaged electronic device of claim 6, further comprising a test circuit having an output coupled to the control input of the switching circuit.

8. The packaged electronic device of claim 6, wherein the switching circuit is configured to selectively operate in one of three states responsive to a signal at the control input of the switching circuit, the three states including:
a first state in which the first output of the switching circuit is coupled to the first input of the switching circuit and the second output of the switching circuit is coupled to the second input of the switching circuit;
a second state in which the first output of the switching circuit is coupled to the second input of the switching circuit and the second output of the switching circuit is coupled to the first input of the switching circuit; and
a third state in which the first output and the second output of the switching circuit are coupled to the second input of the switching circuit.

9. A packaged electronic device, comprising:
a load circuit having a power input;
a resistor having a first terminal and a second terminal, the first terminal of the resistor coupled to a supply node, and the second terminal of the resistor coupled to the power input;
a second load circuit having a second power input;
a second resistor having a first terminal and a second terminal, the first terminal of the second resistor coupled to the supply node, and the second terminal of the second resistor coupled to the second power input;
a multiplexer having a first input, a second input, an output and a control input, the first input of the multiplexer coupled to the second terminal of the resistor, and the second input of the multiplexer coupled to the second terminal of the second resistor; and
an analog to digital converter (ADC) having a first input, a second input and an output, the first input of the ADC coupled to the first terminal of the resistor, the second input of the ADC coupled to the second terminal of the resistor.

10. The packaged electronic device of claim 9, further comprising a test circuit having an output coupled to the control input of the multiplexer.

11. A packaged electronic device, comprising:
a die with a load circuit, a resistor and an analog to digital converter (ADC);
wherein the resistor is coupled between a supply node of the die and a power input of the load circuit;
wherein the ADC has a first input coupled to a first terminal of the resistor, and a second input coupled to a second terminal of the resistor; and
wherein voltage is measurable across the resistor while a supply voltage is applied to the supply node to determine a load current conducted by the load circuit.

12. A packaged electronic device, comprising:
a die with a load circuit, a resistor and an analog to digital converter (ADC);
wherein the resistor is coupled between a supply node of the die and a power input of the load circuit;
wherein the ADC has a first input coupled to a first terminal of the resistor, and a second input coupled to a second terminal of the resistor;
wherein voltage is measurable across the resistor while a supply voltage is applied to the supply node to determine a load current conducted by the load circuit;
a first switch having a first terminal, a second terminal, and a first control input, the first terminal of the first switch coupled to the first terminal of the resistor, and the second terminal of the first switch coupled to the second terminal of the resistor;
a second load circuit having a second power input;
a second resistor having a first terminal and a second terminal, the first terminal of the second resistor coupled to the supply node, and the second terminal of the second resistor coupled to the second power input;
a second switch having a first terminal, a second terminal, and a second control input, the first terminal of the second switch coupled to the first terminal of the second resistor, and the second terminal of the second switch coupled to the second terminal of the second resistor; and
a multiplexer having a first input, a second input, an output and a control input, the first input of the multiplexer coupled to the second terminal of the resistor, and the second input of the multiplexer coupled to the second terminal of the second resistor.

13. The packaged electronic device of claim 12, further comprising a memory coupled to the output of the multiplexer.

14. The packaged electronic device of claim 12, further comprising:
a first lead coupled to the first control input of the first switch;
a second lead coupled to the second control input of the second switch;
a third lead coupled to the control input of the multiplexer; and
a fourth lead coupled to the supply node.

15. The packaged electronic device of claim 12, further comprising a test circuit having first output, a second output and a third output, the first output coupled to the first control input of the first switch, the second output coupled to the second control input of the second switch, and the third output coupled to the control input of the multiplexer.

16. A packaged electronic device, comprising:
a die with a load circuit, a resistor and an analog to digital converter (ADC);
wherein the resistor is coupled between a supply node of the die and a power input of the load circuit;
wherein the ADC has a first input coupled to a first terminal of the resistor, and a second input coupled to a second terminal of the resistor;
wherein voltage is measurable across the resistor while a supply voltage is applied to the supply node to determine a load current conducted by the load circuit;
a second load circuit having a second power input; and
a switching circuit having a first input, a second input, a first output, a second output and a control input, the first input of the switching circuit coupled to the second terminal of the resistor, and the second input of the switching circuit coupled to the first terminal of the resistor, the first output of the switching circuit coupled to the power input, and the second output of the switching circuit coupled to the second power input.

17. The packaged electronic device of claim 16, further comprising a test circuit having an output coupled to the control input of the switching circuit.

18. The packaged electronic device of claim 16, wherein the switching circuit is configured to selectively operate in one of three states responsive to a signal at the control input of the switching circuit, the three states including:
a first state in which the first output of the switching circuit is coupled to the first input of the switching circuit and the second output of the switching circuit is coupled to the second input of the switching circuit;
a second state in which the first output of the switching circuit is coupled to the second input of the switching circuit and the second output of the switching circuit is coupled to the first input of the switching circuit; and
a third state in which the first output and the second output of the switching circuit are coupled to the second input of the switching circuit.

19. A packaged electronic device, comprising:
a die with a load circuit, a resistor and an analog to digital converter (ADC);
wherein the resistor is coupled between a supply node of the die and a power input of the load circuit;
wherein the ADC has a first input coupled to a first terminal of the resistor, and a second input coupled to a second terminal of the resistor;
wherein voltage is measurable across the resistor while a supply voltage is applied to the supply node to determine a load current conducted by the load circuit;
a second load circuit having a second power input;
a second resistor having a first terminal and a second terminal, the first terminal of the second resistor coupled to the supply node, and the second terminal of the second resistor coupled to the second power input; and
a multiplexer having a first input, a second input, an output and a control input, the first input of the multiplexer coupled to the second terminal of the resistor, and the second input of the multiplexer coupled to the second terminal of the second resistor.

20. The packaged electronic device of claim 19, further comprising a test circuit having an output coupled to the control input of the multiplexer.

* * * * *